(12) United States Patent
Marquez (10) Patent No.: US 12,328,951 B2
(45) Date of Patent: Jun. 10, 2025

(54) SOLAR GLASS ASSEMBLY

(71) Applicant: GIGA MEGA JOULES INC., Katy, TX (US)

(72) Inventor: Juan Marquez, Sealy, TX (US)

(73) Assignee: GIGA MEGA JOULES INC., Katy, TX (US)

( * ) Notice: Subject to any disclaimer, the term of this patent is extended or adjusted under 35 U.S.C. 154(b) by 0 days.

(21) Appl. No.: 18/730,241

(22) PCT Filed: Jan. 18, 2023

(86) PCT No.: PCT/US2023/011041
§ 371 (c)(1),
(2) Date: Jul. 18, 2024

(87) PCT Pub. No.: WO2023/141151
PCT Pub. Date: Jul. 27, 2023

(65) Prior Publication Data
US 2025/0151417 A1 May 8, 2025

Related U.S. Application Data

(60) Provisional application No. 63/300,484, filed on Jan. 18, 2022.

(51) Int. Cl.
*H10F 19/80* (2025.01)
*H02S 30/10* (2014.01)
(Continued)

(52) U.S. Cl.
CPC ........... *H10F 19/807* (2025.01); *H02S 30/10* (2014.12); *H02S 40/34* (2014.12); *H10F 19/70* (2025.01); *H10F 77/484* (2025.01)

(58) Field of Classification Search
CPC ........ H02S 30/10; H10F 19/20; H10F 19/807; H10F 19/70; H10F 77/42
See application file for complete search history.

(56) References Cited

U.S. PATENT DOCUMENTS

2007/0256726 A1  11/2007  Fork et al.
2011/0132436 A1*  6/2011  Nakata ................. H10F 19/902
                                                                  136/251
(Continued)

FOREIGN PATENT DOCUMENTS

| CN | 108321227 A | * | 7/2018 | ......... H01L 31/0481 |
| WO | 2009105587 A2 | | 8/2009 | |
| WO | WO-2020179590 A1 | * | 9/2020 | |

OTHER PUBLICATIONS

English machine translation of WO20200179590A1 (Year: 2020).*
English machine translation of CN10832227A (Year: 2018).*

*Primary Examiner* — Kourtney R S Carlson
(74) *Attorney, Agent, or Firm* — Mark C. Johnson; Johnson |Dalal (57) ABSTRACT

A solar glass assembly configured to generate energy and including a framing assembly having a plurality of framing elements enclosing a cavity, an upper frame surface, and a lower frame surface opposing the upper frame surface, an upper transparent glass layer coupled to the upper frame surface, defining a plurality of enclosed lens apertures with a plurality of magnifying lenses disposed therein and a lower glass layer coupled to the framing assembly and opposing the upper transparent glass layer, and a plurality of honeycomb lattice structures each housed within the cavity, of an electrically and thermally conductive material, interposed between the upper transparent glass layer and the lower glass layer, electrically coupled to a diode, and housing a semiconductor material within a cavity therein, directly coupled thereto, and disposed underneath one of the plurality of magnifying lenses to focus incoming solar light to the semiconductor material.

17 Claims, 5 Drawing Sheets

(51) Int. Cl.
*H02S 40/34* (2014.01)
*H10F 19/70* (2025.01)
*H10F 77/42* (2025.01)

(56) References Cited

U.S. PATENT DOCUMENTS

| | | |
|---|---|---|
| 2013/0298958 A1 | 11/2013 | Kopylov |
| 2014/0174508 A1 | 6/2014 | Sznerski et al. |
| 2015/0064831 A1* | 3/2015 | Furihata .................. H10F 71/00 |
| | | 438/64 |
| 2019/0036480 A1 | 1/2019 | Barr et al. |
| 2021/0280732 A1 | 9/2021 | Abouraddy et al. |

* cited by examiner

SOLAR GLASS ASSEMBLY

FIELD OF THE INVENTION

The present invention relates generally to glass assembly operably configured to generate energy from solar radiation, and, more particularly, relates to solar glass assemblies utilizing a layup and semiconductor material to generate energy by using heat from the solar radiation.

BACKGROUND OF THE INVENTION

There are many known solar technology devices and methods utilized to convert sunlight into electrical energy either through PV panels, some of which utilize mirrors that concentrate solar radiation to the PV panels or cells. This energy can be used to generate electricity or be stored in batteries or thermal storage. While solar power has its obvious advantages (e.g., renewable source of energy), it is also characterized by significant limitations. Chief among them are the relative inefficiency of PV cells. More specifically, in accordance with the Shockley-Queisser limit, the maximum solar conversion efficiency is around 33.7% for a single p-n junction PV cell, assuming typical sunlight conditions (i.e., unconcentrated, AM 1.5 solar spectrum), and subject to other caveats and assumptions. This maximum efficiency occurs at a band gap of 1.34 eV. Further, PV panels and arrays can be large and bulky, taking up excessive amounts of space which can be inconvenient or inefficient, particularly where large-scale PV arrays are utilized.

Therefore, a need exists to overcome the problems with the prior art as discussed above.

SUMMARY OF THE INVENTION

The invention provides a solar glass assembly that overcomes the hereinafore-mentioned disadvantages of the heretofore-known devices and methods of this general type, which is more lightweight than some systems of solid material, and that generates a significant amount of energy output with a safe and effective assembly that may be electrically and operably coupled with other assemblies to store or transfer electrical energy generated from sunlight.

With the foregoing and other objects in view, there is provided, in accordance with the invention, a solar glass assembly having a framing assembly with a plurality of framing elements enclosing a cavity, having an upper frame surface, and a lower frame surface opposing the upper frame surface, an upper transparent glass layer coupled to the upper frame surface, defining a plurality of enclosed lens apertures with a plurality of magnifying lenses disposed therein and a lower glass layer coupled to the framing assembly and opposing the upper transparent glass layer, and a plurality of honeycomb lattice structures each housed within the cavity, of an electrically and thermally conductive material, interposed between the upper transparent glass layer and the lower glass layer, electrically coupled to a diode, and housing a semiconductor material within a cavity therein, directly coupled thereto, and disposed underneath one of the plurality of magnifying lenses.

In accordance with another feature of one embodiment of the present invention, the plurality of honeycomb lattice structures each have a plurality of electrically and thermally conductive strips having a plurality raised platforms and coupled together with a plurality of fasteners.

In accordance with a further feature of the present invention, the plurality of electrically and thermally conductive strips are of a sheet material formed into a rectangular undulating configuration.

In accordance with yet another further feature of the present invention, the plurality of electrically and thermally conductive strips collectively define a plurality of cavities therein and having a semiconductor material disposed in each of the plurality of cavities.

In accordance with a further feature of the present invention, the plurality of electrically and thermally conductive strips each define an enclosed aperture spatially accessible to the cavity within the honeycomb lattice structure.

In accordance with a further feature of one embodiment of the present invention, an electrically and thermally conductive spacing member is interposed between the plurality of electrically and thermally conductive strips and surrounding the semiconductor material.

In accordance with an additional feature of one embodiment of the present invention, the plurality of electrically and thermally conductive strips and the electrically conductive spacing member are of a copper material.

In accordance with another feature of one embodiment of the present invention, a plurality of solar glass assemblies are operably and electrically couplable together with an electrical connector electrically coupled to an electrical diode port on each of the plurality of solar glass assemblies.

In accordance with an exemplary feature of one embodiment of the present invention, the upper and lower glass layers are substantially planar and each and also include a perimeter edge coupled around the upper frame surface and the lower frame surface, respectively.

In accordance with another feature of one embodiment of the present invention, the upper transparent glass layer includes an upper surface and a lower surface opposing the upper surface of the upper transparent glass layer, wherein the lower surface of the upper transparent glass layer has a thermally conductive coating thereon and thermally contacting one of the plurality of electrically conductive strips.

In accordance with another feature of one embodiment of the present invention, an internal glass layer is coupled to the framing assembly, interposed between the plurality of honeycomb lattice structures and the lower glass layer, has an upper surface, and has a lower surface opposing the upper surface of the internal glass layer and having a thermally conductive coating thereon and thermally contacting another of the plurality of electrically and thermally conductive strips.

In accordance with a further feature of one embodiment of the present invention, a polyester resin layer is interposing the internal glass layer and the lower glass layer.

In accordance with another feature of one embodiment of the present invention, the framing assembly is of an electrically and thermally insulated material.

In accordance with another feature of one embodiment of the present invention, the semiconductor material includes at least one material from the following group: graphene flakes, boron phosphide granules, and black phosphorus.

Although the invention is illustrated and described herein as embodied in a solar glass assembly, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms.

Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having." as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time. Also, for purposes of description herein, the terms "upper", "lower", "left," "rear," "right." "front," "vertical," "horizontal," and derivatives thereof relate to the invention as oriented in the figures and is not to be construed as limiting any feature to be a particular orientation, as said orientation may be changed based on the user's perspective of the device. Furthermore, there is no intention to be bound by any expressed or implied theory presented in the preceding technical field, background, brief summary or the following detailed description.

As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the assembly or the electrically conductive strips depicted in the figures.

BRIEF DESCRIPTION OF THE DRA WINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

DETAILED DESCRIPTION

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

The present invention provides a novel and efficient solar glass assembly that overcomes the known limitations of existing prior art and is operably configured (i.e., when operational) to effectively, efficiently, and safely convert solar radiation into a usable form of electricity, e.g., 2500 W/hr.

Figure 1:
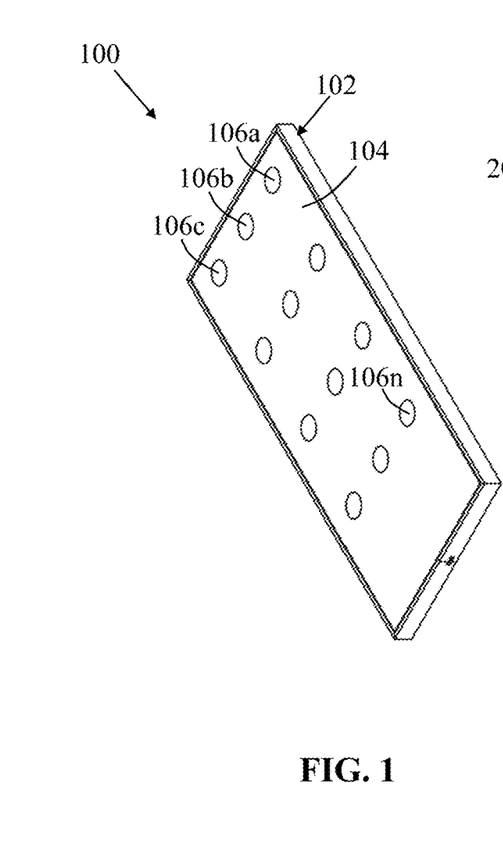
FIG. 1 is a perspective view of a solar glass assembly in accordance with one exemplary embodiment of the present invention.
Figure 2:
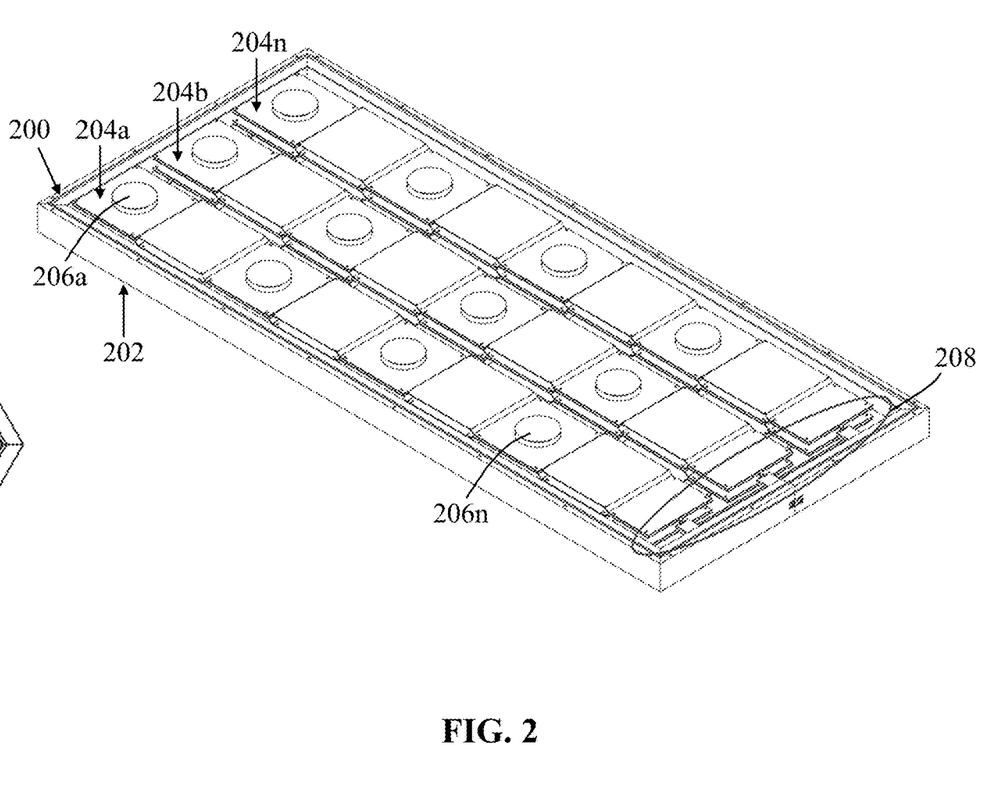
FIG. 2 is a fragmentary view of the solar glass assembly in FIG. 1 with the top glass removed in accordance with one embodiment of the present invention.
Figure 3:
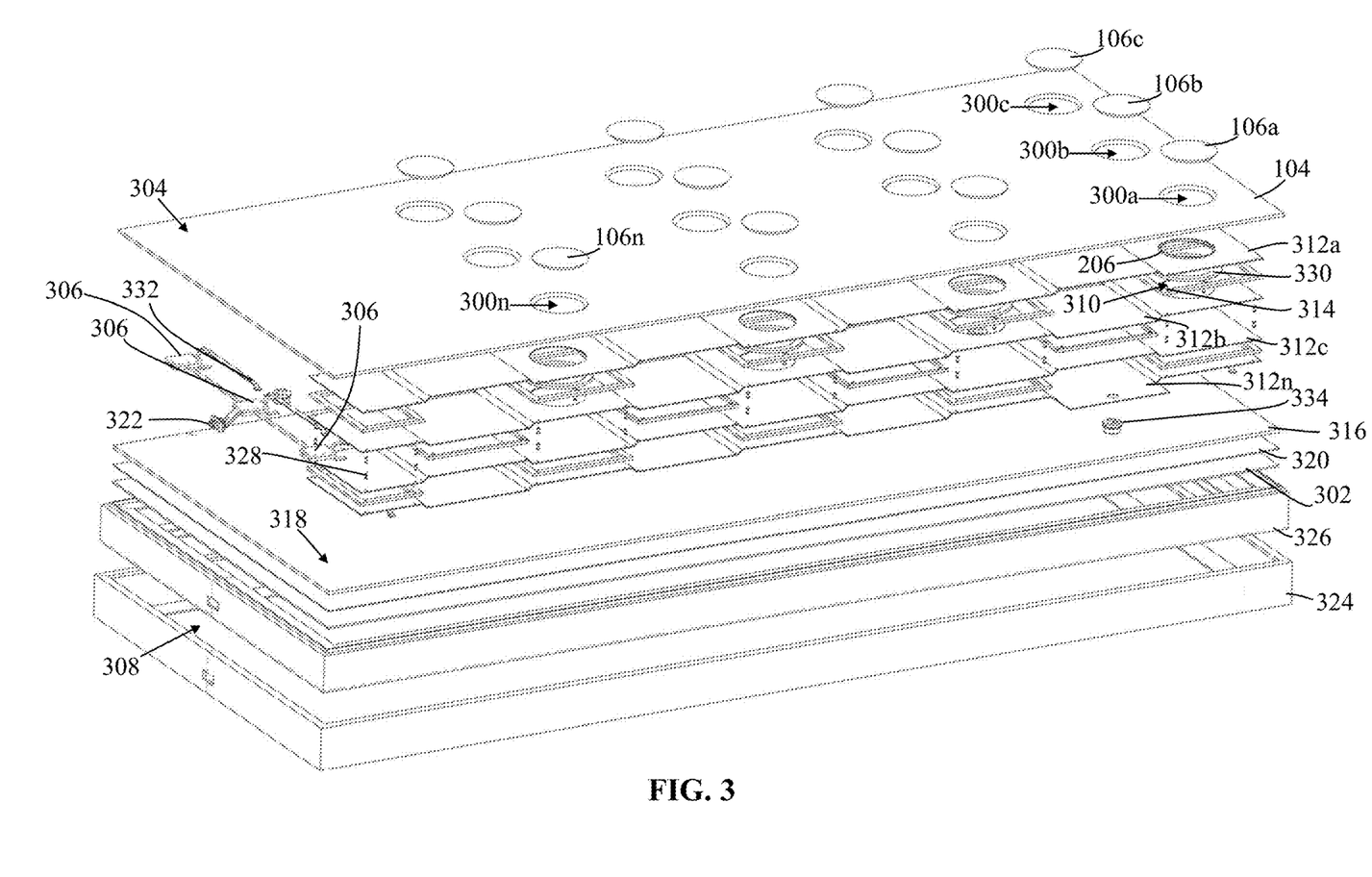
FIG. 3 is an exploded view of the solar glass assembly in FIG. 1 in accordance with one embodiment of the present invention.

Referring now to FIG. 1, one embodiment of the present invention is shown in a perspective view. FIG. 1 shows several advantageous features of the present invention, but, as will be described below, the invention can be provided in several shapes, sizes, combinations of features and components, and varying numbers and functions of the components. The first example of a solar glass assembly 100, as shown in FIGS. 1-4, includes a framing assembly 102 having a plurality of framing elements 102*a-n* that are preferably of an electrically insulated material, e.g., aluminum. As best seen in FIG. 3, the framing assembly 102 may include an outer or outside frame 324 having one or more frame elements configured in a "C" shape, wherein a first inner frame 326 is operably configured to be inserted within the outside frame 324. The first inner frame 326 has one or more frame elements configured in an "I" shape, wherein components or layers utilized with the invention are operably configured to be housed and retained. In one embodiment, the first inner frame 326 includes a strip of ceramic fiberboard or refractory board facing inside the cavity 308, that surrounds the inner perimeter of the first inner frame 326, and beneficially prevents or substantially inhibits heat loss during periods of shading.

In one embodiment, the outside frame 324 has a length of approximately 1972 mm, a width of approximately 854 mm, and a thickness of approximately 80 mm. The outside frame 324 of the framing assembly 102 encloses or defines a cavity 308 where other frame members and/or components utilized with the assembly 100 are housed and retained.

Figure 4:
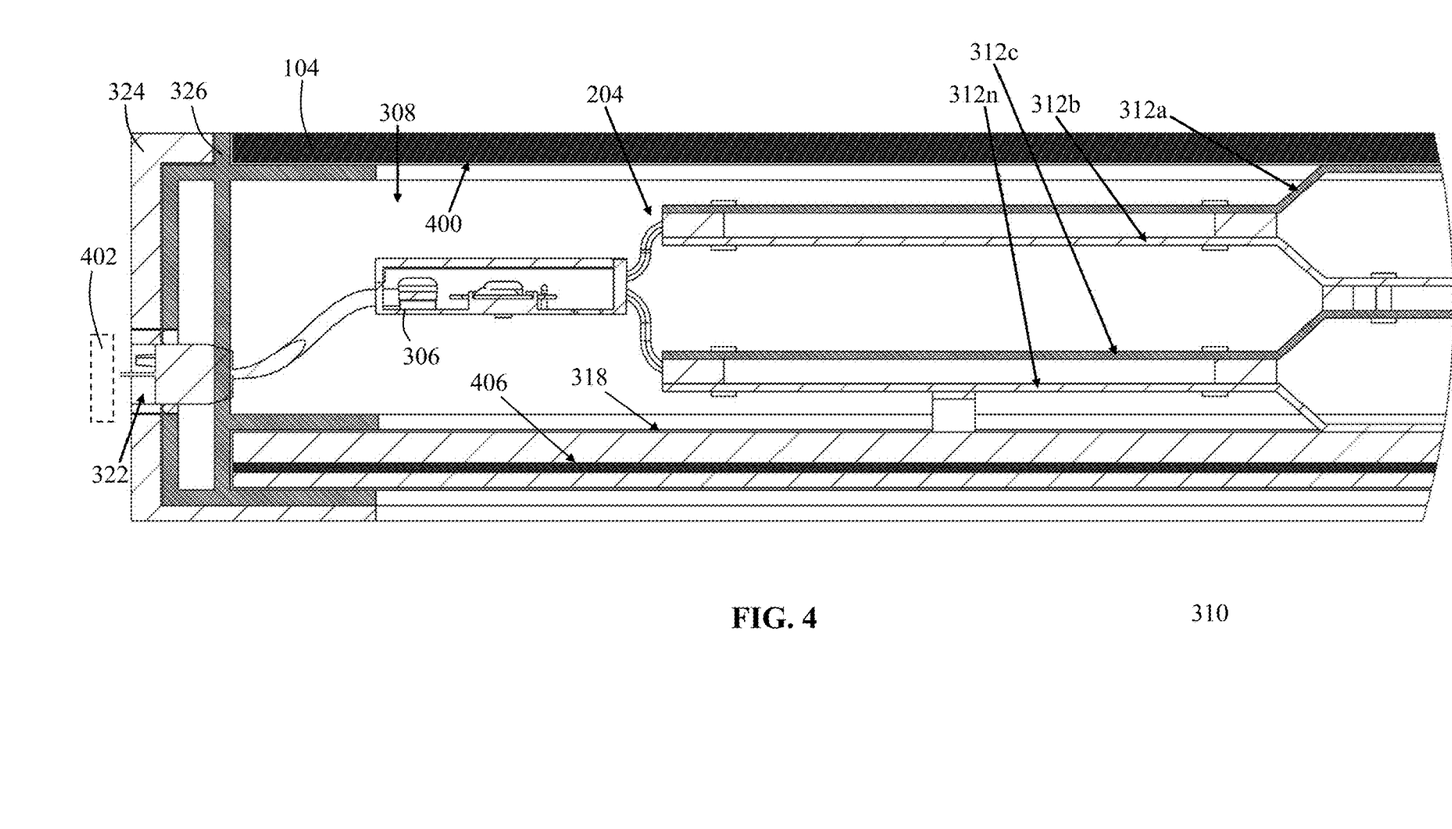
FIG. 4 is a partial cross-sectional view of the solar glass assembly in accordance with one embodiment of the present invention.

The framing assembly 102 has an upper frame surface 200 that may be defined by the first inner frame 326 and a lower frame surface 202 opposing the upper frame surface 200 that may also be defined by the outside frame 324. The assembly 100 beneficially includes an upper transparent glass layer 104 that may have a similar shape, yet a smaller size, compared to the outside frame 324, e.g., a longitudinal length of approximately 1871 mm, a width of approximately 753 mm, and a thickness of approximately 6 mm, or ¼ in. As best seen in FIG. 4, the upper transparent glass layer 104 may be retained on the first inner frame 326, e.g., around an upper lip or flange thereon. In some embodiments, the upper transparent glass layer 104 may be retained on the framing assembly 102 with adhesive or, in other embodiments, physical fasteners. The upper transparent glass layer 104 is coupled to the upper frame surface 200 and is preferably substantially level or coplanar with the upper surface or wall of the outside frame 324 and/or the first inner frame 326. The upper and lower glass layers 104, 302 are preferably substantially planar (i.e., with no raised surfaces greater than 25 mm) and are coupled to the framing assembly 102 around a perimeter edge thereon. Said another way, the upper and lower glass layers 104, 302 include a perimeter edge coupled around the upper frame surface 200 and the lower frame surface 202, respectively, of the frame assembly 102.

The upper transparent glass layer 104 can be seen defining a plurality of enclosed lens apertures 300a-n that may have a diameter of approximately 102 mm and beneficially include one a plurality of magnifying lenses 106a-n disposed therein, wherein "n" represents any number greater than one. The magnifying lenses 106a-n may also be of glass or other transparent material, may have a diameter of approximately equaling a diameter of lens apertures 300a-n, and are configured with concave surface or curved sides for concentrating or dispersing light rays. The assembly 100 also includes a lower glass layer 302 that may be similarly dimensioned to the upper transparent glass layer 104, but is of a less thickness, e.g., approximately 4 mm, ⅛ in. The lower glass layer 302 may be of a tempered glass and is coupled to the framing assembly 102. The lower glass layer 302 can be seen opposing the upper transparent glass layer 104 and is also preferably transparent.

To generate electric energy in an effective and efficient manner, the assembly 100 includes a plurality of honeycomb lattice structures 204a-n each housed within the cavity 300. The plurality of honeycomb lattice structures 204a-n may consist of a plurality of electrically conductive strips 312a-n of an electrically conductive material, e.g., copper. The honeycomb lattice structures 204a-n can be seen defining a plurality of cavities or channels (i.e., a honeycomb structure) with interconnected material (i.e., a lattice structure) preferably oriented in the longitudinal direction. Some of the cavities have a semiconductor material therein, intensified by a lens 106 located above the semiconductor material, and some of the cavities do not have a lens 106 overhead the semiconductor material, yet said semiconductor material is activated by virtue of the heat generated within the assembly. The honeycomb lattice structure beneficially provides a more lightweight structure than other systems of solid material, and an effective structure conducive for directing sunlight and generating heat conductively to a semiconductor material (e.g., material 206a-n). The honeycomb lattice structures 204a-n are beneficially interposed between the upper transparent glass layer 104 and the lower glass layer 302, electrically coupled to a diode 306, and house and retain a semiconductor material within a cavity 310 within the honeycomb lattice structure 204. The semiconductor material 206 is also directly coupled thereto to generate electrical energy and is beneficially disposed underneath one of the plurality of magnifying lenses 106a-n. In one embodiment, the semiconductor material 206 is concentrically located underneath one of the plurality of magnifying lenses 106a-n. The semiconductor material may be selected in whole or in part from one or more of the following materials that includes graphene flakes, boron phosphide granules, ground black phosphorus, or other comparable material(s).

In preferred embodiments, there are at least three rows of longitudinally aligned honeycomb lattice structures 204a-n each defined with at least four electrically conductive strips 312a-n and each disposed in a parallel orientation with one another. Each of the honeycomb lattice structures 204a-n include four magnifying lenses 106a-n aligned with one another and equally spaced with one another. As such, the assembly 100 is configured to operate whereby the semiconductor material 206 housed in the honeycomb lattice structures 204a-n is operably configured to generate an electrical current when subjected to solar radiation and that is electrically transferrable to the diodes 306, wherein each of the diodes 306 may be supported by an electrically insulated frame member 332 can be found at one end of the assembly 100, represented with line 208 in FIG. 2.

Each of the honeycomb lattice structures 204a-n may be approximately 64 inches long and 8 inches wide. In an exemplary embodiment, each of the honeycomb lattice structures 204a-n consist of thirteen 8 in by 8 in clusters in a continuous honeycomb lattice configuration, for a total of 39 clusters in a 32 in×76 in exemplary assembly 100. The cavities in the honeycomb lattice structures 204a-n may also consist of three 8 in thick hollow spaces within the lattice that are created by inserting a 0.375 in thick copper spacer (approximately 0.0625 in thick) around the plurality of honeycomb lattice structures 204a-n.

In one embodiment, the plurality of honeycomb lattice structures 204 each have a plurality of electrically conductive strips 312a-n with a plurality raised platforms offset from one another with a lowered platform and coupled together with one or more fasteners, e.g., electrically conductive rivets (see exemplary rivet 328). The spatial and structural configuration of the plurality of honeycomb lattice structures 204a-n enables the semiconductor material 206 to be efficiently and effectively stored and induced with solar radiation. To that end, the plurality of electrically conductive strips 312a-n may be of a sheet material formed into a rectangular undulating configuration that define cavities within the honeycomb lattice structure 204 of a thickness of approximately 10-25 mm. The plurality of honeycomb lattice structures 204 may be fastened or retained within the assembly with one or more fasteners, e.g., fastener 334.

Figure 5:
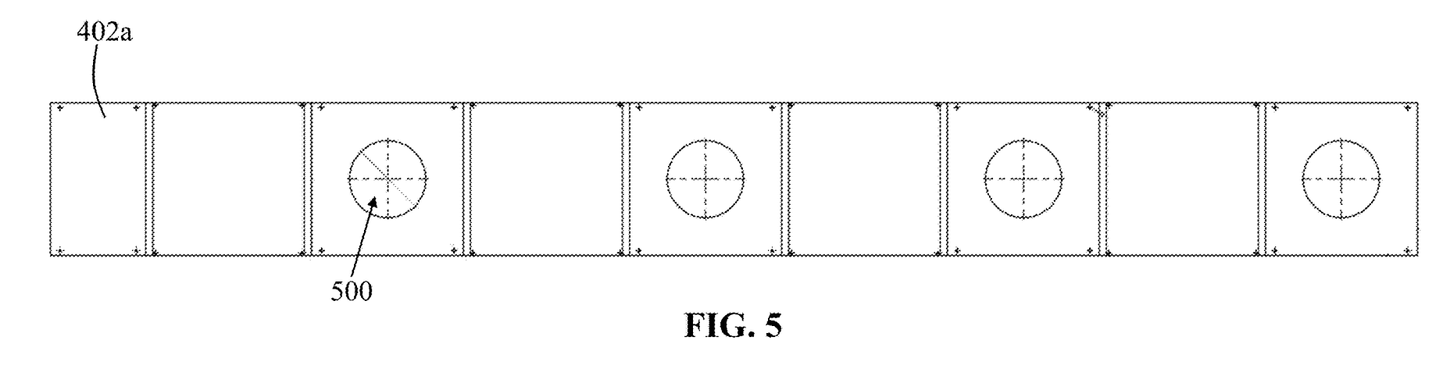
FIGS. 5-6 depict a top plan view and an elevational side view, respectively, of an exemplary electrically conductive strip utilized with a honeycomb lattice structure utilized with the solar glass assembly in accordance with one embodiment of the present invention.
Figure 6:
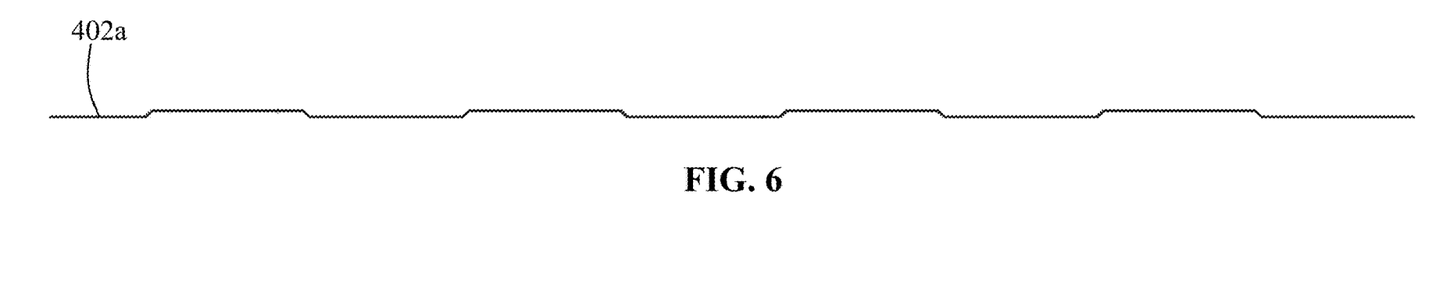
Figure 7:
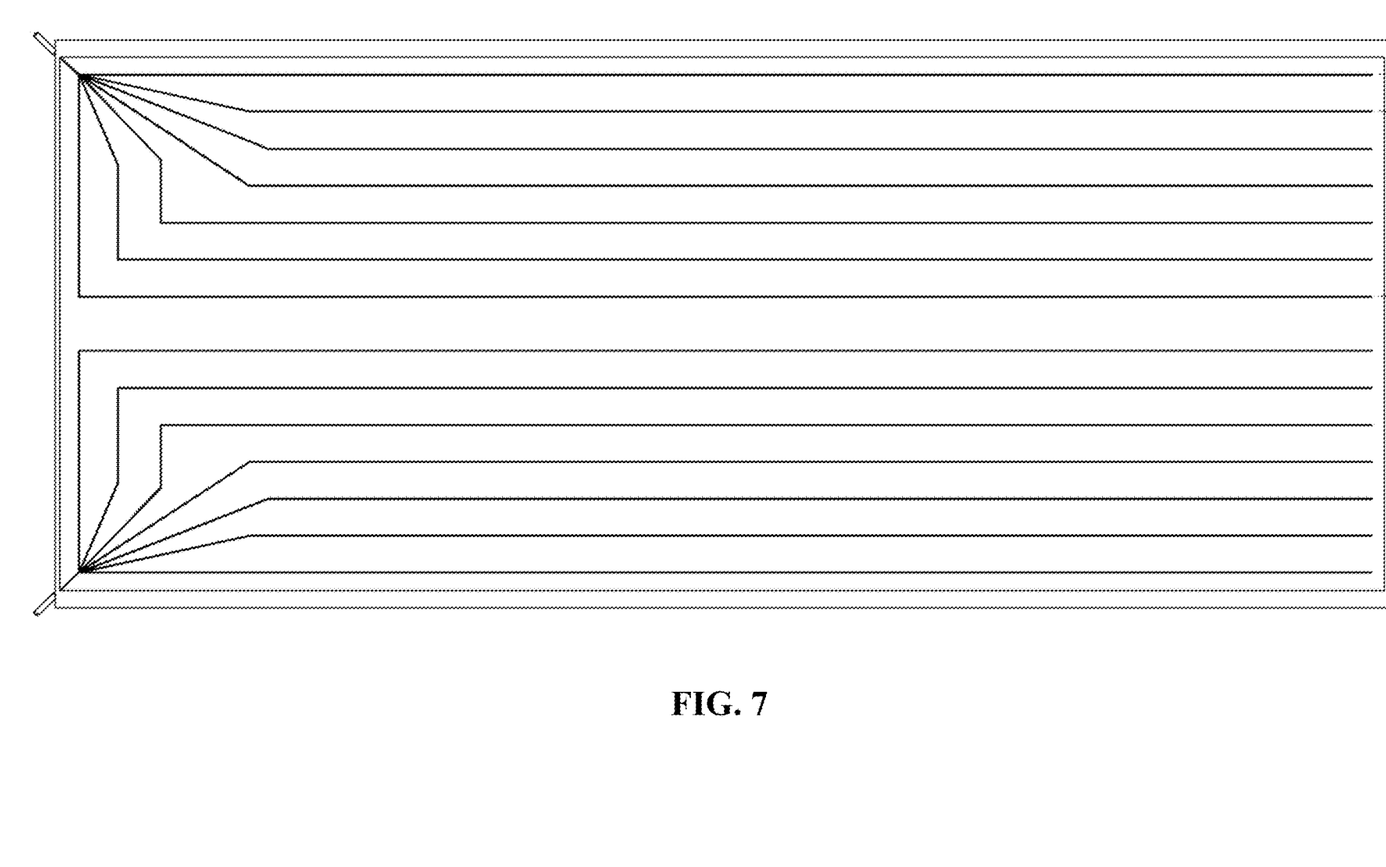
FIG. 7 depicts a composite copper wire schematic utilized with the solar glass assembly in FIG. 1 in accordance with one embodiment of the present invention.

In one embodiment, the plurality of electrically conductive strips 312a-n each define an enclosed aperture 500 spatially accessible to the cavity within the honeycomb lattice structure 204 where the semiconductor material 206 is retained. In one embodiment, the assembly 100 utilizes an electrically conductive spacing member 314 interposed between the plurality of electrically conductive strips 312a-n that surrounds the semiconductor material 206. The electrically conductive spacing member 314 may be beneficially formed in the shape of each raised or lowered platform around a perimeter edge thereon. In lieu or in addition to the electrically conductive spacing member 314, an electrically conductive spacing member 330 formed in an annular shape may also be utilized and that may be formed around the semiconductor material 206. Like the plurality of electrically conductive strips 312a-n, the electrically conductive spacing member 314 may be made with a copper material.

In one embodiment, the assembly 100 is electrically couplable with another assembly 100 formed in the same manner with a connector 402, e.g., an MC4 multibranch connector. Said another way, the present invention may include a plurality of solar glass assemblies 100 operably and electrically couplable together with an electrical connector 402 electrically coupled to an electrical diode port 322 on each of the plurality of solar glass assemblies. In one embodiment, the frame assembly 102, namely the outside frame 324 and the first inner frame 326 define apertures for receiving the electrical diode port 322.

In one embodiment, the upper transparent glass layer 104 includes an upper surface 304 and a lower surface 400 opposing the upper surface 304 of the upper transparent glass layer 104, wherein the lower surface 400 of the upper transparent glass layer 104 has an electrically conductive and transparent coating thereon, e.g., a transparent conductive oxide. One or more of the plurality of electrically conductive strips 312a-n configured to electrically contact the lower surface 400 of the upper transparent glass layer 104, i.e., enabling electrical current to flow thereon or therethrough. In some embodiments, direct coupling is required, wherein the honeycomb lattice structures 204a-n are directedly coupled to the lower surface 400 of the upper transparent glass layer 104.

Additionally, the assembly 100 may also include an internal glass layer 316 coupled to the framing assembly 102, interposed between the plurality of honeycomb lattice structures 204a-n and the lower glass layer 302. The internal glass layer 316 may also be transparent and includes an upper surface 318 and a lower surface 406 opposing the upper surface 318 of the internal glass layer 316. When referencing "surfaces" herein, said term may include the entire area of a structure where said surface is located. The lower surface 406 may also include an thermally conductive coating thereon that is configured to electrically contact another of the plurality of electrically conductive strips 312a-n (best seen in FIG. 4).

The assembly 100 may also beneficially include a polyester resin layer 320 interposing the internal glass layer 316 and the lower glass layer 302, wherein the polyester resin layer 320 is configured to operate without degradation at very high temperatures. The polyester resin layer 320 may be of an opaque or black material. In one embodiment, the lower glass layer 302 includes a ceramic fiber layer 320 laminated thereto and sandwiched by the internal glass layer 316. The polyester resin layer 320 may also be infused with 200-micron particle sizes of Boron Phosphide, black Phosphorus crystals, graphene, or pure copper flakes. Also laminated in the polyester resin layer 320 may include direct current (DC) wires that will exit therefrom and the lower glass layer 302.

At each end of the honeycomb lattice structures 204a-n (preferably at the distal or terminal end) are DC wires of a preset gauge attached to one or more high-current diodes which are connected to external electrical wires on a positive and negative terminal. Therefore, the assembly 100 is operably configured to convert solar radiation into a usable electric current by generating heat. Specifically, upon direct sunlight or solar radiation to the top surface of the assembly 100, i.e., to the upper glass layer 104 and lenses 106a-n, the upper glass layer 104 will heat up and generate heat. This constant radiation will gradually increase the temperature within the assembly 100 causing an accelerated temperature rise to occur. Because the lower surface 400 of the upper glass layer 104 with the conductive coating thereon is in electrical and thermal contact with the honeycomb lattice structures 204a-n, heat is actively transferred onto the conductive material within the honeycomb lattice structures 204a-n while simultaneously creating an active conductivity zone.

The plurality of lenses 102a-n create an intensified heat stream to the conductive material 206 therein. The material 206 retained by the honeycomb lattice structures 204a-n produce the conduction of electrical current. As heat transfers through to the lower level of honeycomb lattice structures 204a-n, heat is also increased, intensified, and directed to the material 206, whereby the lower glass layer 306, namely the polyester resin layer coupled thereto keeps the assembly insulated and inhibits radiation and heat from passing therethrough. As such, within a 15-30 minute approximate time lapse of sun heat generating radiation and due to the high accumulated heat within the assembly 100, the heat will activate the positive and negative conductive materials inside the material. This activation of electrical current runs through the honeycomb lattice structures 204a-n, namely the plurality of electrically conductive strips 312a-n, that house the materials 206. The plurality of electrically conductive strips 312a-n will facilitate in the transportation of electrical current and will exit into the external electrical wires attached to the terminal ends of each electrically conductive strips 312a-n and into a high-current diode bar followed by a positive and negative exit wire.

Additionally, the bottom laminated portion of the assembly 100 includes a black polyester resin interlayer. When heat is generated and intensifies, heat transfer is effectuated through use of the conductive coatings, thereby maintaining an elevated heat temperature during periods of shading, resulting in a continuous and substantially uninterrupted production of electrical current for an extended period of time. A ceramic fiber layer may be adhered to the lower glass layer 106 beneath the black laminated glass, followed by the metal plate, to insulate, preserve, and prevent heat loss. In an exemplary embodiment, the thickness of the assembly 100 as a whole is approximately 3-5 in.

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the above-described features.

What is claimed is:

1. A solar glass assembly comprising:
   a framing assembly having a plurality of framing elements enclosing a cavity, having an upper frame surface, and a lower frame surface opposing the upper frame surface;
   an upper transparent glass layer coupled to the upper frame surface, defining a plurality of enclosed lens apertures with a plurality of magnifying lenses disposed therein and a lower glass layer coupled to the framing assembly and opposing the upper transparent glass layer; and
   a plurality of honeycomb lattice structures of an electrically and thermally conductive material, each housed within the cavity, interposed between the upper transparent glass layer and the lower glass layer, electrically coupled to a diode, having a plurality of electrically and thermally conductive strips forming a plurality of vertically offset platforms coupled together with at least one fastener, and housing a semiconductor material within a cavity therein, directly coupled thereto, and disposed underneath one of the plurality of magnifying lenses.

2. The solar glass assembly according to claim 1, wherein the plurality of electrically and thermally conductive strips are of a sheet material formed into a rectangular undulating configuration.

3. The solar glass assembly according to claim 2, wherein the plurality of electrically and thermally conductive strips collectively define a plurality of cavities therein and having a semiconductor material disposed in each of the plurality of cavities.

4. The solar glass assembly according to claim 3, wherein the plurality of electrically and thermally conductive strips each define an enclosed aperture spatially accessible to the cavity within the honeycomb lattice structure.

5. The solar glass assembly according to claim 3, further comprising:
an electrically and thermally conductive spacing member interposed between the plurality of electrically and thermally conductive strips and surrounding the semiconductor material.

6. The solar glass assembly according to claim 5, further comprising:
the plurality of electrically and thermally conductive strips and the electrically and thermally conductive spacing member are of a copper material.

7. The solar glass assembly according to claim 1, further comprising a plurality of solar glass assemblies operably and electrically couplable together with an electrical connector electrically coupled to an electrical diode port on each of the plurality of solar glass assemblies.

8. The solar glass assembly according to claim 1, wherein the upper and lower glass layers are substantially planar and each further comprise: a perimeter edge coupled around the upper frame surface and the lower frame surface, respectively.

9. The solar glass assembly according to claim 1, wherein the upper transparent glass layer further comprises:
an upper surface and a lower surface opposing the upper surface of the upper transparent glass layer, the lower surface of the upper transparent glass layer having a thermally conductive coating thereon and thermally contacting one of the plurality of electrically and thermally conductive strips.

10. The solar glass assembly according to claim 9, further comprising:
an internal glass layer coupled to the framing assembly, interposed between the plurality of honeycomb lattice structures and the lower glass layer, having an upper surface, and having a lower surface opposing the upper surface of the internal glass layer and having a thermally conductive coating thereon and thermally contacting at least one of the plurality of electrically and thermally conductive strips.

11. The solar glass assembly according to claim 10, further comprising:
a polyester resin layer interposing the internal glass layer and the lower glass layer.

12. The solar glass assembly according to claim 11, wherein the framing assembly is of an electrically and thermally insulated material.

13. The solar glass assembly according to claim 1, wherein the semiconductor material includes at least one material from the following group:
graphene flakes, boron phosphide granules, and black phosphorus.

14. A solar glass assembly comprising:
a framing assembly having a plurality of electrically and thermally insulated framing elements enclosing a cavity, having an upper frame surface, and a lower frame surface opposing the upper frame surface;
an upper transparent glass layer coupled to the upper frame surface, defining a plurality of enclosed lens apertures with a plurality of magnifying lenses disposed therein and a lower glass layer coupled to the framing assembly and opposing the upper transparent glass layer, the upper transparent glass layer having an upper surface and a lower surface opposing the upper surface of the upper transparent glass layer, wherein the lower surface of the upper transparent glass layer has a thermally conductive coating thereon;
a plurality of honeycomb lattice structures of an electrically and thermally conductive material, each housed within the cavity, interposed between the upper transparent glass layer and the lower glass layer, electrically coupled to a diode, having a plurality of electrically and thermally conductive strips forming a plurality of vertically offset platforms coupled together with at least one fastener, and housing a semiconductor material within a cavity therein, directly coupled thereto, and disposed underneath one of the plurality of magnifying lenses;
an internal glass layer coupled to the framing assembly, interposed between the plurality of honeycomb lattice structures and the lower glass layer, having an upper surface, and having a lower surface opposing the upper surface of the internal glass layer and having a thermally conductive coating thereon and thermally contacting at least one of the plurality of honeycomb lattice structures; and
a polyester resin layer interposing the internal glass layer and the lower glass layer.

15. The solar glass assembly according to claim 14, wherein the semiconductor material includes at least one material from the following group:
graphene flakes, boron phosphide granules, and black phosphorus.

16. The solar glass assembly according to claim 15, wherein the plurality of electrically and thermally conductive strips are of a sheet material formed into a rectangular undulating configuration.

17. The solar glass assembly according to claim 5, wherein the plurality of electrically and thermally conductive strips collectively define a plurality of cavities therein and having a semiconductor material disposed in each of the plurality of cavities.

* * * * *